(12) United States Patent
Patel et al.

(10) Patent No.: US 8,137,896 B2
(45) Date of Patent: Mar. 20, 2012

(54) METHOD OF PREPARING LITHOGRAPHIC PRINTING PLATES

(75) Inventors: Jayanti Patel, Ft. Collins, CO (US); Paul R. West, Ft. Collins, CO (US); Shashikant Saraiya, Ft. Collins, CO (US); Nicki R. Miller, Ft. Collins, CO (US); Frederic E. Mikell, Greeley, CO (US)

(73) Assignee: Eastman Kodak Company, Rochester, NY (US)

( * ) Notice: Subject to any disclaimer, the term of this patent is extended or adjusted under 35 U.S.C. 154(b) by 684 days.

(21) Appl. No.: 12/181,371

(22) Filed: Jul. 29, 2008

(65) Prior Publication Data

US 2010/0028806 A1 Feb. 4, 2010

(51) Int. Cl.
*G03F 1/00* (2006.01)
*G03F 7/00* (2006.01)
*B41F 7/00* (2006.01)

(52) U.S. Cl. ............. 430/302; 430/281.1; 430/294; 430/434; 430/435; 101/450.1; 101/453; 101/463.1

(58) Field of Classification Search ............. 430/270.1, 430/302
See application file for complete search history.

(56) References Cited

U.S. PATENT DOCUMENTS

| | | | |
|---|---|---|---|
| 4,572,887 A * | 2/1986 | Geissler | 430/288.1 |
| 4,749,639 A * | 6/1988 | Frommeld | 430/175 |
| 6,649,319 B2 | 11/2003 | Fiebag et al. | |
| 2003/0113667 A1* | 6/2003 | Matsumura | 430/302 |
| 2004/0191675 A1* | 9/2004 | Verschueren et al. | 430/270.1 |
| 2004/0191678 A1* | 9/2004 | Vermeersch et al. | 430/270.1 |
| 2005/0266349 A1 | 12/2005 | Van Damme et al. | |
| 2007/0269739 A1 | 11/2007 | Nguyen et al. | |
| 2008/0070152 A1 | 3/2008 | Yu et al. | |
| 2008/0102406 A1 | 5/2008 | Fukawa | |
| 2009/0311482 A1* | 12/2009 | Tao et al. | 428/172 |

FOREIGN PATENT DOCUMENTS

| | | |
|---|---|---|
| EP | 1 621 339 | 2/2006 |
| EP | 1 788 431 A2 | 5/2007 |
| EP | 1 829 681 A2 | 9/2007 |
| EP | 1829681 A2 * | 9/2007 |
| EP | 1 947 514 A2 | 7/2008 |
| WO | 2005/111727 | 11/2005 |

OTHER PUBLICATIONS

U.S. Appl. No. 11/872,772, filed Oct. 16, 2007, titled Methods for Imaging and Processing Negative-Working Imageable Elements by Kevin B. Ray et al.
U.S. Appl. No. 11/949,817, filed Dec. 4, 2007, titled Methods of Using Violet-Sensitive Imageable Elements by Kevin B. Ray et al.

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

A negative-working lithographic printing plate precursor can be imaged with infrared radiation and processed in a single step using a single processing solution having a pH of from about 3 to 11. The precursor has a primary polymeric binder that comprises recurring units derived from one or more N-alkoxymethyl(meth)acrylamides, provided that such recurring units are present in the primary polymeric binder in an amount of at least 10% based on the total dry primary polymeric binder weight. In addition, the primary polymeric binder is present in an amount of from about 12 to about 70% based on total imageable layer dry weight. The imaged precursor can be processed off-press or on-press.

19 Claims, No Drawings

METHOD OF PREPARING LITHOGRAPHIC PRINTING PLATES

FIELD OF THE INVENTION

This invention provides a method for preparing lithographic printing plates using a generally "neutral" processing solution after imaging. The imageable lithographic printing plate precursors of this invention contain primary polymeric binders that comprise recurring units derived from one or more N-alkoxymethyl(meth)acrylamides.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise at least one imageable layer applied over the hydrophilic surface of a substrate. The imageable layer(s) include one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged (exposed) regions are removed, the element is considered as positive-working. Conversely, if the non-imaged (non-exposed) regions are removed, the element is considered as negative-working. In each instance, the regions of the imageable layer (that is, the image areas) that remain are ink-receptive, and the regions of the hydrophilic surface revealed by the developing process accept water or a fountain solution and repel ink.

Direct digital imaging has become increasingly important in the printing industry. Imageable elements for the preparation of lithographic printing plates have been developed for use with infrared lasers.

Development of negative-working elements using gums is described for example, in EP Publications 1,751,625 (Van Damme et al. published as WO 2005/111727) 1,788,429 (Loccufier et al. et al.), 1,788,430 (Williamson et al.), 1,788,431 (Van Damme et al.), 1,788,434 (Van Damme et al.), 1,788,441 (Van Damme), 1,788,442 (Van Damme), 1,788,443 (Van Damme), 1,788,444 (Van Damme), and 1,788,450 (Van Damme), and WO 2007/057442 (Gries et al.). High pH processing solutions for developing and finishing are described in U.S. Pat. No. 5,035,982 (Walls) and U.S. Pat. No. 6,649,319 (Fiebag et al.). In addition, copending and commonly assigned U.S. Ser. No. 11/872,772 that was filed Oct. 16, 2007 by K. Ray, Tao, Miller, Clark, and Roth) describes negative-working imageable elements that are sensitive to infrared radiation and can be processed using gum solutions.

Copending and commonly assigned U.S. Ser. No. 11/949,817 (filed Dec. 4, 2007 by K. Ray, Tao, and Clark) describes the use of gums to develop imaged UV-sensitive, negative-working imageable elements that contain specific nonpolymeric diamide additives.

U.S. Patent Application Publication 2008/70152 (J. Yu et al.) describes processing of imaged negative-working imageable elements containing copolymers derived from N-methoxymethylmethacrylamide using a highly alkaline developer.

U.S. Patent Application Publication 2007/269739 (Nguyen et al.) describes on-press development of similar elements.

Problem to be Solved

While there are a number of commercially useful negative-working lithographic printing plate precursors in the market and many others described in the patent literature, they have generally been developed (processed) using high pH aqueous developers. It would be desirable to avoid such toxic and corrosive processing solutions and to use processing solutions that are more environmentally acceptable to develop and optionally protect the surface of negative-working lithographic printing plate precursors.

SUMMARY OF THE INVENTION

This invention provides a method of making an image comprising:

A) imagewise exposing a negative-working lithographic printing plate precursor using imaging radiation to provide both exposed and non-exposed regions in the imageable layer, the lithographic printing plate precursor comprising a substrate and having thereon an imageable layer comprising:

a free-radically polymerizable component, an initiator composition that is capable of generating free radicals sufficient to initiate polymerization of the free-radically polymerizable component upon exposure to the imaging radiation in the presence of a radiation absorbing compound, a radiation absorbing compound, and a primary polymeric binder that comprises recurring units derived from one or more N-alkoxymethyl(meth)acrylamides, provided that such recurring units are present in the primary polymeric binder in an amount of at least 10% based on the total dry primary polymeric binder weight, wherein said primary polymeric binder is present in an amount of from about 12 to about 70% based on total imageable layer dry weight, and B) applying a processing solution to the imaged precursor to remove predominantly only the non-exposed regions, the processing solution having a pH of from about 3 to about 11.

This invention provides a lithographic printing plate obtained by this method.

In addition, the present invention provides a method of lithographic printing comprising:

A) imagewise exposing a negative-working lithographic printing plate precursor using imaging radiation to provide both exposed and non-exposed regions in the imageable layer, the lithographic printing plate precursor comprising a substrate and having thereon an imageable layer comprising:

a free-radically polymerizable component, an initiator composition that is capable of generating free radicals sufficient to initiate polymerization of the free-radically polymerizable component upon exposure to the imaging radiation in the presence of a radiation absorbing compound, a radiation absorbing compound, and a primary polymeric binder that comprises recurring units derived from one or more N-alkoxymethyl(meth)acrylamides, provided that such recurring units are present in the primary polymeric binder in an amount of at least 10% based on the total dry primary polymeric binder weight, wherein said primary polymeric binder is present in an amount of from about 12 to about 70% based on total imageable layer dry weight, B) applying a processing solution to the imaged precursor both (1) to remove predominantly only the non-exposed regions, and (2) to provide a protective coating over all of the exposed and non-exposed regions of the resulting lithographic printing plate, the processing solution having a pH of from about 3 to about 11 and comprising at least 0.1 weight % of an anionic surfactant, C) removing excess processing solution from the lithographic printing plate, and optionally drying the lithographic printing plate, and D) without removing the protective coating, using the lithographic printing plate for printing an image using a lithographic printing ink.

In another embodiment, a method of making an image comprising:

A) imagewise exposing a negative-working lithographic printing plate precursor using imaging radiation to provide both exposed and non-exposed regions in the imageable layer, the lithographic printing plate precursor comprising a substrate and having thereon an imageable layer comprising:

a free-radically polymerizable component, an initiator composition that is capable of generating free radicals sufficient to initiate polymerization of the free-radically polymerizable component upon exposure to the imaging radiation in the presence of a radiation absorbing compound, a radiation absorbing compound, and a primary polymeric binder that comprises recurring units derived from one or more N-alkoxymethyl(meth)acrylamides, provided that such recurring units are present in the primary polymeric binder in an amount of at least 10% based on the total dry primary polymeric binder weight, wherein said primary polymeric binder is present in an amount of from about 12 to about 70% based on total imageable layer dry weight, and B) processing the imaged precursor on-press using a fountain solution, lithographic printing ink, or both, to remove predominantly only the non-exposed regions.

This invention also includes a negative-working lithographic printing plate precursor comprising a substrate and having thereon an imageable layer comprising:

a free-radically polymerizable component, an initiator composition that is capable of generating free radicals sufficient to initiate polymerization of the free-radically polymerizable component upon exposure to imaging radiation in the presence of a radiation absorbing compound, a radiation absorbing compound, and a primary polymeric binder that comprises recurring units derived from one or more N-alkoxymethyl(meth)acrylamides, provided that such recurring units are present in the primary polymeric binder in an amount of at least 10% based on the total dry primary polymeric binder weight, wherein said primary polymeric binder is present in an amount of from about 12 to about 70% based on total imageable layer dry weight.

The lithographic printing plates prepared according to this invention can be used right away for lithographic printing after processing. This simpler and essentially one-step processing procedure provides advantages in work-flow and productivity in preparing the printing plates for use in the pressroom. In many embodiments, a single processing step replaces the traditionally separate development and gumming steps. The single processing solution is less harmful to the environment and easier to handle and less toxic for disposal. All of these advantages further reduce costs of processing as well. In addition, in situations where it might be preferable to use separate developing and gumming steps, the processing (developing) solution need not be highly alkaline, nor does it need to contain significant amounts of organic solvents. The avoidance of such components greatly simplifies the disposal of used processing solution. Furthermore, imageable elements of the present invention should be amenable to post-processing heat treatments for the purposes of increasing printing endurance and resistance to harsh printing chemicals. These advantages made are possible by the use of a specific primary polymeric binder having a certain weight fraction of recurring units derived from one or more N-alkoxymethyl(meth)acrylamides.

DETAILED DESCRIPTION OF THE INVENTION

Definitions

Unless the context indicates otherwise, when used herein, the terms "lithographic printing plate precursor" and "negative-working lithographic printing plate precursor" are meant to be references to embodiments of the present invention.

In addition, unless the context indicates otherwise, the various components described herein such as "primary polymeric binder", "secondary polymeric binder", "free-radically polymerizable component", "initiator", "radiation absorbing compound", "IR dye", and similar terms also refer to mixtures of such components. Thus, the use of the article "a" or "an" is not necessarily meant to refer to only a single component.

By the term "remove predominantly only said non-exposed regions" during development, we mean that the non-exposed regions of the imageable layer and the corresponding regions of any underlying layers are selectively and preferentially removed by the processing solution, but not the exposed regions to any significant extent (there may be insubstantial removal of the exposed regions).

By "computer-to-press", we mean the imaging means is carried out using a computer-directed imaging means (such as a laser) directly to the imageable layers without using masking or other intermediate imaging films.

Unless otherwise indicated, the term "single processing solution" is meant to refer to the slightly acidic to slightly alkaline solutions (generally "neutral" solutions) described herein that are used to carry out the processing step B) of the methods of this invention.

Unless otherwise indicated, percentages refer to percents by dry weight, either the dry solids of a layer composition or formulation, or the dry coated weight of a layer (for example, imageable layer or topcoat). Unless otherwise indicated, the weight percent values can be interpreted as for either a layer formulation or a dried layer coating.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The method of this invention is used primarily to provide lithographic printing plates that can be used in lithographic printing operations as described in more detail below. In general, the lithographic printing plate precursors comprise a substrate, an imageable layer, and an optional topcoat or outermost oxygen-barrier layer disposed over the imageable layer.

Substrate

The lithographic printing plate precursors are formed by suitable application of an imageable layer formulation or composition onto a suitable substrate. This substrate can be an untreated or uncoated support but it is usually treated or coated in various ways as described below to provide a highly hydrophilic surface prior to application of the imageable layer composition. The substrate comprises a support that can be composed of any material that is conventionally used to prepare lithographic printing plate precursors. The substrate can be treated to provide an "interlayer" for improved adhesion or hydrophilicity, and the inner layer formulation is applied over the interlayer.

The substrate is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A useful substrate is composed of an aluminum-containing support that may be coated or treated using techniques known in the art, including physical graining, electrochemical graining, chemical graining, and anodizing. For example, the aluminum sheet can be anodized using phosphonic acid or sulfuric acid using conventional procedures.

An optional interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid-acrylic acid copolymer, poly(acrylic acid), or (meth)acrylic acid copolymer, or mixtures thereof. For example, the grained and/or sulfuric acid-anodized aluminum support can be treated with poly(phosphonic acid) using known procedures to improve surface hydrophilicity to provide a lithographic hydrophilic substrate.

The thickness of the substrate can be varied but should be sufficient to sustain the wear from printing and thin enough to wrap around a printing form. Such embodiments typically include a treated aluminum foil having a thickness of from about 100 to about 600 µm.

The backside (non-imaging side) of the substrate may be coated with antistatic agents and/or slipping layers or a matte layer to improve handling and "feel" of the imageable element.

The substrate can also be a cylindrical surface having the imageable layers applied thereon, and thus be an integral part of the printing press or a sleeve that is incorporated onto a press cylinder. The use of such imaged cylinders is described for example in U.S. Pat. No. 5,713,287 (Gelbart).

Imageable Layer Composition

The imageable layer used in the lithographic printing plate precursors is generally composed of a radiation-sensitive composition having several components. For example, the radiation-sensitive composition (and imageable layer) comprises one or more free radically polymerizable components, each of which contains one or more free radically polymerizable groups that can be polymerized using free radical initiation. For example, such secondary free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used.

Suitable ethylenically unsaturated compounds that can be polymerized or crosslinked include ethylenically unsaturated polymerizable monomers that have one or more of the polymerizable groups, including unsaturated esters of alcohols, such as acrylate and methacrylate esters of polyols. Oligomers and/or prepolymers, such as urethane acrylates and methacrylates, epoxide acrylates and methacrylates, polyester acrylates and methacrylates, polyether acrylates and methacrylates, and unsaturated polyester resins can also be used. In some embodiments, the secondary free radically polymerizable component comprises carboxy groups.

Useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers. Free radically polymerizable compounds include those derived from urea urethane(meth)acrylates or urethane(meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), Sartomer 415 [ethoxylated (20) trimethylolpropane triacrylate], Sartomer 480 [ethoxylated

(10) bisphenol A dimethacrylate], and Sartomer 499 [ethoxylated (6) trimethylolpropane triacrylate] that are available from Sartomer Company, Inc.

Numerous other free radically polymerizable compounds are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (noted above), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.).

The free radically polymerizable component can be present in the radiation-sensitive composition (imageable layer) at a weight ratio to the primary polymeric binder (described below) of from about 5:95 to about 95:5, from about 10:90 to about 90:10, or from about 30:70 to about 70:30. For example, the free radically polymerizable component can be present in an amount of at least 10 and up to and including 70% based on the total solids in the radiation sensitive composition, or the total dry weight of the imageable layer.

The radiation-sensitive composition also includes an initiator composition that is capable of generating free radicals sufficient to initiate polymerization of all the various free radically polymerizable components upon exposure of the composition to imaging radiation, and in the presence of a suitable radiation absorbing compound (described below). The initiator composition is generally responsive to electromagnetic imaging radiation in the ultraviolet, visible, infrared, or near infrared spectral regions, corresponding to the spectral range of at least 150 nm and up to and including 1500 nm. For example, they can be responsive to infrared radiation of at least 700 nm and up to and including 1400 nm (for example from about 750 to about 1250 nm). Other initiator compositions are responsive to "violet" radiation of from about 250 to about 425 nm. Initiator compositions are used that are appropriate for the desired imaging wavelength(s).

In general, suitable initiator compositions comprise compounds that include but are not limited to, amines (such as alkanol amines), thiol compounds, anilinodiacetic acids or derivatives thereof, N-phenyl glycine and derivatives thereof, N,N-dialkylaminobenzoic acid esters, N-arylglycines and derivatives thereof (such as N-phenylglycine), aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, alkyltriarylborates, trihalogenomethylarylsulfones, benzoin ethers and esters, triaryloxazoles, coumarins, stilbenyl derivatives, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), boron-containing compounds (such as tetraarylborates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts). Other known initiator composition components are described for example in U.S Patent Application Publication 2003/0064318 (noted above).

Co-initiators can also be used, such as metallocenes (such as titanocenes and ferrocenes), polycarboxylic acids, haloalkyl triazines, thiols, or mercaptans (such as mercaptotriazoles), borate salts, and photooxidants containing a heterocyclic nitrogen that is substituted by an alkoxy or acyloxy group, as described in U.S. Pat. No. 5,942,372 (West et al.).

In some embodiments, useful initiator compositions include a combination of a 2,4,5-triarylimidazolyl dimer and a thiol compound such as either 2,2'-bis(o-chlorophenyl)-4,4',5,5'-tetraphenylbiimidazole or 2,2'-bis(o-chlorophenyl)-4,4',5,5'-tetra(m-methoxyphenyl)biimidazole in combination with a thiol compound such as a mercaptotriazole.

Useful radiation-sensitive compositions include an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. Nos. 5,086,086 (Brown-Wensley et al.), 5,965,319 (Kobayashi), and 6,051,366 (Baumann et al.). For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N≡N$^+$). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, sulfonates, hydroxide, perchlorate, n-butyltriphenyl borate, tetraphenyl borate, and others readily apparent to one skilled in the art.

The halonium salts that are useful include iodonium salts. In one embodiment, the onium salt has a positively-charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Useful boron-containing compounds include organic boron salts that include an organic boron anion such as those described in the noted U.S. Pat. No. 6,569,603 that is paired with a suitable cation such as an alkali metal ion, an onium, or a cationic sensitizing dye. Useful onium cations for this purpose include but are not limited to, ammonium, sulfonium, phosphonium, iodonium, and diazonium cations. Iodonium salts such as iodonium borates are useful as initiator compounds in radiation-sensitive compounds that are designed for "on-press" development (described in more detail below). They may be used alone or in combination with various co-initiators such as heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the radiation-sensitive composition. Useful mercaptotriazoles include 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2,4-triazole.

Examples of other useful initiator compositions are described for example in EP 1,182,033 (Fujimaki et al.) and in U.S. Pat. No. 6,352,812 (Shimazu et al.) and U.S. Pat. No. 6,893,797 (Munnelly et al.).

One class of useful iodonium cations include diaryliodonium cations that are represented by the following Structure (IB):

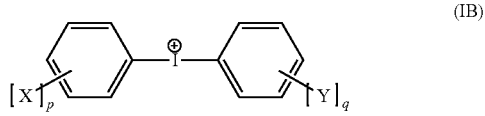

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, isopropoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Typically, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated but the "symmetric" compounds are preferred (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but typically they are at the 2- or 4-positions on either or both phenyl rings.

Despite what type of X and Y groups are present in the iodonium cation, the sum of the carbon atoms in the X and Y substituents generally is at least 6, and typically at least 8, and up to 40 carbon atoms. Thus, in some compounds, one or more X groups can comprise at least 6 carbon atoms, and Y does not exist (q is 0). Alternatively, one or more Y groups can comprise at least 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is at least 6. Still again, there may be a total of at least 6 carbon atoms on both phenyl rings.

In Structure IB, p and q are independently 0 or integers of 1 to 5, provided that either p or q is at least 1. Typically, both p and q are at least 1, or each of p and q is 1. Thus, it is understood that the carbon atoms in the phenyl rings that are not substituted by X or Y groups have a hydrogen atom at those ring positions.

Useful boron-containing anions are organic anions having four organic groups attached to the boron atom. Such organic anions can be aliphatic, aromatic, heterocyclic, or a combination of any of these. Generally, the organic groups are substituted or unsubstituted aliphatic or carbocyclic aromatic groups. For example, useful boron-containing anions can be represented by the following Structure (IB$_Z$):

wherein $R_1$, $R_2$, $R_3$, and $R_4$ are independently substituted or unsubstituted alkyl groups having 1 to 12 carbon atoms (such as methyl, ethyl, n-propyl, isopropyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms. None of the R₁ through R₄ groups contains halogen atoms and particularly fluorine atoms.

Typically, $R_1$, $R_2$, $R_3$, and $R_4$ are independently substituted or unsubstituted alkyl or aryl groups as defined above, and more typically, at least 3 of $R_1$, $R_2$, $R_3$, and $R_4$ are the same or different substituted or unsubstituted aryl groups (such as substituted or unsubstituted phenyl groups). For example, all of $R_1$, $R_2$, $R_3$, and $R_4$ can be the same or different substituted or unsubstituted aryl groups, or all of the groups are the same substituted or unsubstituted phenyl group. $Z^-$ can be a tetraphenyl borate wherein the phenyl groups are substituted or unsubstituted (for example, all are unsubstituted phenyl groups).

Some representative iodonium borate compounds include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-4'-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis(penta-fluorophenyl)borate, 4-methylphenyl-4'-dodecylphenyliodonium tetrakis(4-fluorophenyl)borate, bis(dodecylphenyl)iodonium tetrakis(pentafluorophenyl)-borate, and bis(4-t-butylphenyl)iodonium tetrakis(1-imidazolyl)borate. Mixtures of two or more of these compounds can also be used in the iodonium borate initiator composition.

Such diaryliodonium borate compounds can be prepared, in general, by reacting an aryl iodide with a substituted or unsubstituted arene, followed by an ion exchange with a borate anion. Details of various preparatory methods are described in U.S. Pat. No. 6,306,555 (Schulz et al.), and references cited therein, and by Crivello, *J. Polymer Sci., Part A: Polymer Chemistry*, 37, 4241-4254 (1999), both of which are incorporated herein by reference.

The boron-containing anions can also be supplied as part of infrared radiation absorbing dyes (for example, cationic dyes) as described below. Such boron-containing anions generally are defined as described above with Structure (IBz).

The free radical generating compounds in the initiator composition are generally present in the radiation-sensitive composition in an amount of at least 0.5% and up to and including 30%, and typically at least 2 and up to and including about 20%, based on composition total solids or total dry weight of the imageable layer. The optimum amount of the various initiator components may differ for various compounds and the sensitivity of the radiation-sensitive composition that is desired and would be readily apparent to one skilled in the art.

The lithographic printing plate precursor also includes one or more imaging radiation absorbing compounds (or chromophores or sensitizers) that spectrally sensitize the composition to a desired wavelength. In some embodiments, this imparted sensitivity is at a $\lambda_{max}$ of from about 250 nm and up to and 500 nm, typically from about 350 to about 475 nm and more typically from about 390 to about 430 nm. For example, useful sensitizers for these wavelengths include but are not limited to compounds having the following Formula:

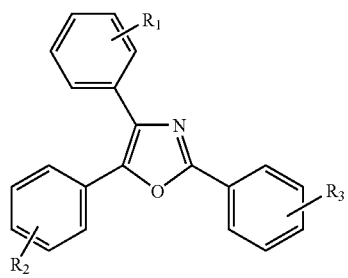

wherein $R_1$, $R_2$ and $R_3$ independently represent a hydrogen atom, alkyl, aryl or aralkyl group that may be substituted, an —$NR_4R_5$-group ($R_4$ and $R_5$ representing an alkyl, aryl or aralkyl group), or —$OR_6$ group ($R_6$ representing an alkyl, aryl or aralkyl group). Particularly useful compounds of this Formula contain at least one of substituent $R_1$, $R_2$, and $R_3$ that represents a donor group, such as an amino group (for example, an dialkylamino group). Such compounds are also described in WO 2004/074930 (Baumann et al.). These compounds can be made following the procedure given in DE 1,120,875 (Sues et al.) and EP 129,059 (Hayashida).

Other embodiments include infrared radiation absorbing compounds ("IR absorbing compounds") that generally absorb radiation at a $\lambda_{max}$ of from about 700 to about 1400 nm and typically from about 750 to about 1250 nm with minimal absorption at 300 to 600 nm.

Examples of suitable IR dyes include but are not limited to, azo dyes, squarylium dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squaraine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are described for example in U.S Patent Application Publication 2005-0130059 (Tao). A general description of one class of suitable cyanine dyes is shown by the formula in paragraph 0026 of WO 2004/101280 (Munnelly et al.).

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), and U.S. Pat. No. 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds include various pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer.

The radiation absorbing compound is generally present in the lithographic printing plate precursor in an amount of at least 0.5% and up to 30 weight % and typically from about 3 to about 25 weight % (based on total dry layer weight). The particular amount needed for this purpose would be readily apparent to one skilled in the art, depending upon the specific compound used and the properties of the processing solution to be used.

The primary polymeric binder useful in the radiation-sensitive composition (and imageable layer) are polymers having a hydrophobic backbone that comprises recurring units derived from one or more different ethlenically unsaturated polymerizable monomers as long as some of those recurring units are derived from one or more N-alkoxymethyl(meth) acrylamides. Such recurring units are present in the primary polymeric binder in an amount of at least 10% based on the total dry primary polymeric binder weight. In other embodiments, the recurring units are present in an amount of from 20 to about 75 weight based on the total primary polymer binder weight.

For example, these recurring units can be derived from of one or more of N-(methoxymethyl)methacrylamide, N-(isobutoxymethyl)meth-acrylamide, N-(isobutoxymethyl)acrylamide, and N-(butoxymethyl)acrylamide.

The primary polymeric binder can also comprise from about 25 to about 90 weight %, based on total primary polymeric binder weight, of recurring units derived from one or more (meth)acrylates, N-substituted cyclic imides, (meth) acrylamides, vinyl carbazole, monomers containing carboxy groups or anhydrides providing carboxy groups, (meth)acrylonitriles, N-vinyl lactams, vinyl esters, and vinyl arenes.

For example, the primary polymeric binder can comprise from about 25 to about 90 weight % of recurring units derived from one or more of N-(methoxymethyl)methacrylamide, N-(isobutoxymethyl)methacrylamide, N-(isobutoxymethyl) acrylamide, and N-(butoxymethyl)acrylamide, and from about 10 to about 75 mol % of recurring units derived from one or more (meth)acrylic acids or esters, based on total primary polymeric binder weight. Particularly useful copolymers include from about 10 to about 75 weight % of recurring units derived from (meth)acrylic acids or esters [e.g. (meth) acrylates].

The primary polymeric binder is generally present in the dry radiation-sensitive composition or imageable layer in an amount of at least 12% and up to and including 70%, and generally from about 25 to about 70%, or typically from about 30 to about 50%, based on total dry weight. Mixtures of two or more of the primary polymeric binders may be used if desired.

The primary polymeric binders can be prepared using known starting materials (monomers) and conventional polymerization conditions. The preparation of representative primary polymeric binders is described below before the Examples.

The radiation-sensitive composition may comprise one or more secondary polymeric binders including particulate polymeric binders. These polymeric binders can be present in the radiation-sensitive composition (or imageable layer) in particulate form, meaning that they exist at room temperature as discrete particles, for example in an aqueous dispersion.

The secondary polymeric binder can be present in the radiation-sensitive composition in an amount of from about 5 to about 45%, based on the total composition (or imageable layer) dry weight.

The secondary polymeric binders can be radically polymerizable polymeric binders. These polymeric binders can be "self-crosslinkable", by which we mean that a separate free radically polymerizable component is not necessary. Such binders can have a backbone comprising multiple (at least two) urethane moieties. In some embodiments, there are at least two of these urethane moieties in each backbone recurring unit. The secondary polymeric binders can also include side chains attached to the backbone, which side chains include one or more free radically polymerizable groups (such as ethylenically unsaturated groups) that can be polymerized (crosslinked) in response to free radicals produced by the initiator composition (described below).

The secondary polymeric binders can also comprise hydrophilic groups including but not limited to, carboxy, sulfo, or phospho groups, either attached directly to the backbone or attached as part of side chains other than the free radically polymerizable side chains.

Other useful secondary polymeric binders that are particulate in form include poly(urethane-acrylic) hybrids that can be either "aromatic" or "aliphatic" in nature depending upon the specific reactants used in their manufacture.

Still other useful particulate secondary polymeric binders are polymers having polyalkylene oxide segments [such as poly(ethylene)oxide and poly(propylene)oxide segments] as described for example in U.S. Pat. No. 6,899,994 (Huang et al.) and U.S. Pat. No. 7,261,998 (Hayashi et al.).

The secondary polymeric binders may be homogenous, that is, dissolved in the coating solvent. Such secondary polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033A1 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), and U.S. Pat. No. 6,893,797 (Munnelly et al.). Also useful are the vinyl carbazole polymers described in U.S. Pat. No. 7,175,949 (Tao et al.), and the polymers having pendant vinyl groups as described in U.S. Pat. No. 7,279,255 (Tao et al.). Copolymers of polyethylene glycol methacrylate/acrylonitrile/styrene in particulate form, dissolved copolymers derived from carboxyphenyl methacrylamide/acrylonitrile/methacrylamide/N-phenyl maleimide, copolymers derived from polyethylene glycol methacrylate/acrylonitrile/vinyl carbazole/styrene/methacrylic acid, copolymers derived from N-phenyl maleimide/methacrylamide/methacrylic acid, copolymers derived from urethane-acrylic intermediate A (the reaction product of p-toluene sulfonyl isocyanate and hydroxyl ethyl methacrylate)/acrylonitrile/N-phenyl maleimide, and copolymers derived from N-methoxymethyl methacrylamide/methacrylic acid/acrylonitrile/N-phenyl-maleimide are useful.

The imageable layer (radiation-sensitive composition) can further comprise one or more phosphate(meth)acrylates, each of which has a molecular weight generally greater than 200 and typically at least 300 and up to and including 1000. By "phosphate(meth)acrylate" we also mean to include "phosphate methacrylates" and other derivatives having substituents on the vinyl group in the acrylate moiety. Such compounds and their use in imageable layers are described in more detail in U.S. Pat. No. 7,175,969 (Ray et al.) that is incorporated herein by reference. These compounds can be nonionic or anionic in nature.

Representative phosphate(meth)acrylates include but are not limited to, ethylene glycol methacrylate phosphate (available from Aldrich Chemical Co.), a phosphate of 2-hydroxyethyl methacrylate that is available as Kayamer PM-2 from Nippon Kayaku (Japan), a phosphate of a di(caprolactone modified 2-hydroxyethyl methacrylate) that is available as Kayamer PM-21 (Nippon Kayaku, Japan), and a polyethylene glycol methacrylate phosphate with 4-5 ethoxy groups that is available as Phosmer M, Phosmer MH, Phosmer PE, Phosmer PEH, Phosmer PP. and Phosmer PPH from Uni-Chemical Co., Ltd. (Japan).

The phosphate(meth)acrylate can be present in the radiation-sensitive composition in an amount of at least 0.5 and up to and including 20% and typically at least 0.9 and up to and including 10%, based on total dry composition weight.

The imageable layer can also include a "primary additive" that is a poly(alkylene glycol) or an ether or ester thereof that has a molecular weight of at least 200 and up to and including 4000. This primary additive can be present in an amount of at least 2 and up to and including 50 weight %, based on the total dry weight of the imageable layer. Useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are Sartomer SR9036 (ethoxylated (30) bisphenol A dimethacrylate), CD9038 (ethoxylated (30) bisphenol A diacrylate), SR399 (dipentaerythritol pentaacrylate), and Sartomer SR494 (ethoxylated (5) pentaerythritol tetraacrylate), and similar compounds all of which that can be obtained from Sartomer Company, Inc. In some embodiments, the primary additive may be "non-reactive" meaning that it does not contain polymerizable vinyl groups.

The imageable layer can also include a "secondary additive" that is a poly(vinyl alcohol), a poly(vinyl pyrrolidone), poly(vinyl imidazole), or polyester in an amount of up to and including 20 weight % based on the total dry weight of the imageable layer.

The imageable layer can also include a variety of optional compounds including but not limited to, colorants and colorant precursors, color developers, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

The radiation-sensitive composition can be applied to a substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Typically, the radiation-sensitive composition is applied and dried to form an imageable layer and a topcoat layer formulation can be applied to that layer.

Illustrative of such manufacturing methods is mixing the radically polymerizable component, primary polymeric binder, initiator composition, radiation absorbing compound, and any other components of the radiation-sensitive composition in water or a suitable organic solvent, or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imageable layer formulations are described in the Examples below. After proper drying, the coating weight of the imageable layer is generally at least 0.5 and up to and including 5 $g/m^2$ or at least 1 and up to and including 3.5 $g/m^2$.

Layers can also be present under the imageable layer to enhance developability or to act as a thermal insulating layer. The underlying layer should be soluble or at least dispersible in the developer and typically have a relatively low thermal conductivity coefficient.

The imageable element may include what is conventionally known as an overcoat or topcoat layer (such as an oxygen impermeable topcoat) applied to and disposed over the imageable layer for example, as described in WO 99/06890 (Pappas et al.). Such topcoat layers comprise one or more water-soluble polymer binders chosen from such polymers as poly(vinyl alcohol)s, poly(vinyl pyrrolidone), poly(ethyleneimine), poly(vinyl imidazole), and copolymers of two or more of vinyl pyrrolidone, ethyleneimine, and vinyl imidazole, and generally have a dry coating weight of at least 0.1 and up to and including 2.5 $g/m^2$ (typically from about 0.4 to about 2 $g/m^2$) in which the water-soluble polymer(s) comprise at least 50% and up to 98% of the dry weight of the topcoat layer. Topcoat layer polymer binders are also described in U.S. Pat. No. 3,458,311 (Alles), U.S. Pat. No. 4,072,527 (Fanni), and U.S. Pat. No. 4,072,528 (Bratt), and EP Publications 275,147A2 (Wade et al.), 403,096A2 (Ali), 354,475A2 (Zertani et al.), 465,034A2 (Ueda et al.), and 352,630A2 (Zertani et al.).

The topcoat layer formulations can be prepared and applied in a similar fashion by dissolving or dispersing the desired components described above in suitable solvents or mixtures of solvents including but not limited to, water or water with one or more of iso-propanol, methanol, or other alcohols or ketones in an amount of up to 15 weight %. A surfactant may be included to improve coatability.

Intermediate drying steps may be used between applications of the various layer formulations to remove solvent(s) before coating other formulations. Drying steps at conventional times and temperatures may also help in preventing the mixing of the various layers.

Once the various layers have been applied and dried on the substrate, the imageable element can be enclosed in water-impermeable material that substantially inhibits the transfer of moisture to and from the imageable element as described in U.S. Pat. No. 7,175,969 (noted above) that is incorporated herein by reference.

The lithographic printing plate precursors can have any useful form including, but not limited to, flat plates, printing cylinders, printing sleeves (solid or hollow cores) and printing tapes (including flexible printing webs).

Lithographic printing plate precursors can be of any size or shape (for example, square or rectangular) having the requisite one or more imageable layers disposed on a suitable substrate. Printing cylinders and sleeves are known as rotary printing members having a substrate and at least one imageable layer in cylindrical form. Hollow or solid metal cores can be used as substrates for printing sleeves.

Imaging

During use, the lithographic printing plate precursors are exposed to a suitable source of imaging radiation at a wavelength of from about 300 to about 1500 nm and typically from about 750 to about 1250 nm. The lasers used for exposure are usually diode lasers, because of the reliability and low maintenance of diode laser systems, but other lasers such as gas or solid-state lasers may also be used. The combination of power, intensity and exposure time for laser imaging would be readily apparent to one skilled in the art.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the printing plate mounted to the interior or exterior cylindrical surface of the drum. Examples of useful infrared imaging apparatus are available as models of Kodak® Trendsetter imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image a precursor while it is attached to the printing plate cylinder. An example of a suitable direct imaging printing press includes the Heidelberg SM74-DI press (available from Heidelberg, Dayton, Ohio).

Useful UV and "violet" imaging apparatus include Prosetter platesetters available from Heidelberger Druckmaschinen (Germany), Luxel Vx-9600 CTP and Luxel V-8 CTP platesetters available from Fuji Photo (Japan), Python platesetter (Highwater, UK), MakoNews, Mako 2, Mako 4, and Mako 8 platesetters available from ECRM (US), Micra platesetter available from Screen (Japan), Polaris and Advantage platesetters available from Agfa (Belgium), LaserJet platesetter available from Krause (Germany), and Andromeda® A750M platesetter available from Lithotech (Germany), Infrared imaging speeds may be in the range of from about 50 to about 1500 mJ/cm$^2$, and typically from about 75 to about 400 mJ/cm$^2$. Image radiation in the UV or "violet" region of the spectrum can be carried out generally using energies of at least 0.01 mJ/cm$^2$ and up to and including 0.5 mJ/cm$^2$ and typically at least 0.02 and up to and including 0.1 mJ/cm$^2$.

While laser imaging is useful in the practice of this invention, imaging can be provided by any other means that provides thermal energy in an imagewise fashion. For example, imaging can be accomplished using a thermoresistive head (thermal printing head) in what is known as "thermal printing", as described for example in U.S. Pat. No. 5,488,025 (Martin et al.) and as used in thermal fax machines and sublimation printers. Thermal print heads are commercially available (for example, as a Fujitsu Thermal Head FTP-040 MCS001 and TDK Thermal Head F415 HH7-1089).

Direct digital imaging is generally used for imaging. The image signals are stored as a bitmap data file on a computer. Raster image processor (RIP) or other suitable means may be used to generate such files. The bitmaps are constructed to define the hue of the color as well as screen frequencies and angles.

Processing and Printing

Imaging of the lithographic printing plate precursor produces a lithographic printing plate that comprises a latent image of imaged (exposed) and non-imaged (non-exposed) regions.

With or without a post-exposure baking (or pre-heat) step after imaging and before processing, the imaged lithographic printing plate precursors can be processed "off-press" using a single processing solution as described below. Processing the imaged element with the processing solution is carried out for a time sufficient to remove predominantly only the non-exposed regions of the imageable layer and underlying portions of any underlayers, and to reveal the hydrophilic surface of the substrate, but not long enough to remove significant amounts of the exposed regions. Thus, the lithographic printing plate precursors are "negative-working". The revealed hydrophilic surface repels ink while the exposed (or imaged) regions accept ink. The non-imaged (non-exposed) regions of the imageable layer(s) are described as being "soluble" or "removable" in the processing solution because they are removed, dissolved, or dispersed within it more readily than the imaged (exposed) regions. Thus, the term "soluble" also means "dispersible". If the imaged element has a topcoat layer, it can be removed between imaging and processing (that is, between steps A and B), or in the processing solution (water) in step B.

In some embodiments, the processing solution may both "develop" the imaged precursors by removing predominantly only the non-exposed regions (development) and also provides a protective layer or coating over the entire imaged and developed surface. In this second aspect, the processing solution can behave somewhat like a gum that is capable of protecting the lithographic image on the printing plate against contamination or damage (for example, from oxidation, fingerprints, dust, or scratches).

There are generally two types of "gum" solutions known in the art: (1) a "bake", "baking", or "pre-bake" gum usually contains one or more compounds that do not evaporate at the usual post-bake temperatures used for making lithographic printing plates, typically an anionic or nonionic surfactant, and (2) a "finisher" gum that usually contains one or more hydrophilic polymers (both synthetic and naturally-occurring, such as gum Arabic cellulosic compounds, (meth) acrylic acid polymers, and polysaccharides) that are useful for providing a protective overcoat on a printing plate. In some embodiments, the processing solution used in the practice of this invention could be generally considered either type of gum.

By using the single processing solution described herein, the conventional aqueous alkaline developer compositions containing silicates or metasilicates, or various organic solvents, can be avoided. In some embodiments, processing solutions containing organic solvents are also avoided. However, if water-miscible solvents such as benzyl alcohol are present, they are present in an amount of up to 15 weight %. Other water-miscible solvents that may be present include but are not limited to, the reaction products of phenol with ethylene oxide and propylene oxide such as ethylene glycol phenyl ether (phenoxyethanol), esters of ethylene glycol and of propylene glycol with acids having six or fewer carbon atoms, and ethers of ethylene glycol, diethylene glycol, and of propylene glycol with alkyl groups having six or fewer carbon atoms, such as 2-ethoxyethanol and 2-butoxyethanol. A single organic solvent or a mixture of organic solvents can be used. By "water-miscible" we mean that the organic solvent or mixture of organic solvents is either miscible with water or sufficiently soluble in the processing solution that phase separation does not occur.

One advantage of this invention is that once the processing solution is used in this manner off-press, no separate rinsing step is necessary before using the resulting lithographic printing plate for printing. However, before printing, any excess processing solution may be removed from the lithographic printing plate by wiping or use of a squeegee or a pair of nip rollers in an apparatus, followed by optional drying using any suitable drying means.

The processing solution may be provided in diluted or concentrated form. The amounts of components described below refer to amounts in the diluted processing solution that is the most likely form for use in the practice of the invention. However, it is to be understood that the present invention includes the use of concentrated processing solutions and the amounts of various components (such as the anionic surfactants) would be correspondingly higher.

The processing solution used in the practice of this invention is an aqueous solution that generally has a pH greater than 3 and up to about 11, and typically from about 5 to about 9, as adjusted using a suitable amount of an acid or base. The viscosity of the processing solution can be adjusted to a value of from about 1.7 to about 5 cP by adding a suitable amount of a viscosity-increasing compound such as a poly(vinyl alcohol) or poly(ethylene oxide).

Useful processing solutions can include water, optionally organic solvents as described above, various anionic or nonionic surfactants or mixtures thereof, antifoamants, chelating agents, organic or inorganic acids or salts thereof, wetting agents, and water-soluble polymers. For example, one useful processing solution is shown below in Invention Example 5 (Table VI). Other useful processing solutions can be prepared using the components described for example in [0014]-[0060] of EP 1,621,339A1 (Nagase) and [0034]-[0081] of U.S. Patent Application Publication 2008/0102406 (Fukawa), both of which are incorporated herein by reference.

In many embodiments, the processing solutions comprise one or more anionic surfactants. Useful anionic surfactants include those with carboxylic acid, sulfonic acid, or phosphonic acid groups (or salts thereof). Anionic surfactants having sulfonic acid (or salts thereof) groups are particularly useful. For example, such anionic surfactants can include aliphates, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxy-polyoxy-ethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylester, salts of alkylsulfuric esters, sulfuric esters of polyoxy-ethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhydride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary anionic surfactant. Such surfactants can be obtained from various suppliers as described in McCutcheon's Emulsifiers & Detergents, 2007 Edition.

Particular examples of such anionic surfactants include but are not limited to, sodium dodecylphenoxyoxybenzene disulfonate, the sodium salt of alkylated naphthalenesulfonate, disodium methylene-dinaphthalene disulfonate, sodium dodecylbenzenesulfonate, sulfonated alkyl-diphenyloxide, ammonium or potassium perfluoroalkylsulfonate and sodium dioctylsulfosuccinate.

The one or more anionic surfactants can be generally present in an amount of at least 0.1 weight %, and typically from about 5 weight % or from about 8 weight % and up to about 45 weight %, or up to about 30 weight % (% solids). In some embodiments, the one or more anionic surfactants can be present in an amount of from about 8 to about 20 weight %.

Two or more anionic surfactants can also be used in combination. In such mixtures, a first anionic surfactant, such as an alkyldiphenyloxide disulfonate, can be present generally in an amount of at least 1 weight % and typically from about 5 to about 20 weight %. A second surfactant can be present (same or different from the first anionic surfactant) in a total amount of at least 1 weight %, and typically from about 3 to about 20 weight %. Second or additional anionic surfactants can be selected from the substituted aromatic alkali alkyl sulfonates and aliphatic alkali sulfates. One particular combination of anionic surfactants includes one or more alkyldiphenyloxide disulfonates and one or more aromatic alkali alkyl sulfonates (such as an alkali alkyl naphthalene sulfonate).

These surfactant-containing processing solutions may optionally include nonionic surfactants as described in [0029] or hydrophilic polymers described in [0024] of EP 1,751,625 (noted above), incorporated herein by reference. Particularly useful nonionic surfactants include Mazol® PG031-K (a triglycerol monooleate, Tween® 80 (a sorbitan derivative), Pluronic® L62LF (a block copolymer of propylene oxide and ethylene oxide), and Zonyl® FSN (a fluorocarbon), and a nonionic surfactant for successfully coating the processing solution onto the printing plate surface, such as a nonionic polyglycol. These nonionic surfactants can be present in an amount of up to 10 weight %, but at usually less than 2 weight % (% solids).

Other optional components of the processing solution include inorganic salts (such as those described in [0032] of U.S. Patent Application Publication 2005/0266349, noted above), wetting agents (such as a glycol), metal chelating agents, antiseptic agents, organic amines, anti-foaming agents, ink receptivity agents (such as those described in [0038] of US '349), and viscosity increasing agents as noted above. Useful amounts of such components are known in the art from their use in traditional alkaline developers or gum solutions. Other useful addenda include but not limited to, phosphonic acids or polycarboxylic acids, or salts thereof that are different than the anionic surfactants described above. Such acids can be present in an amount of at least 0.001 weight % and typically from about 0.001 to about 10 weight % (% solids), and can include but are not limited to, polyaminopolycarboxylic acids, aminopolycarboxylic acids, or salts thereof, [such as salts of ethylenediaminetetraacetic acid (EDTA, sodium salt)], organic phosphonic acids and salts thereof, and phosphonoalkanetricarboxylic acids and salts thereof.

Generally, after imaging for off-press processing, the processing solution is applied to the imaged precursor by rubbing, spraying, jetting, dipping, immersing, coating, or wiping the outer layer with the processing solution or contacting the imaged precursor with a roller, impregnated pad, or applicator containing the single processing solution. For example, the imaged element can be brushed with the processing solution, or the processing solution can be poured onto or applied by spraying the imaged surface with sufficient force to remove the exposed regions using a spray nozzle system as described for example in [0124] of EP 1,788,431A2 (noted above). Still again, the imaged element can be immersed in the processing solution and rubbed by hand or with an apparatus.

The processing solution can also be applied in a processing unit (or station) as a component of a suitable apparatus that has at least one roller for rubbing or brushing the precursor while the processing solution is applied. By using such a processing unit, the exposed regions of the imaged layer may be removed from the substrate more completely and quickly. Residual processing solution may be removed (for example, using a squeegee or nip rollers) or left on the resulting printing plate (and optionally dried) without any rinsing step. It is desirable that processing be carried out using processor systems and apparatus that allow the processing solution to reside on the imaged precursor for sufficient time of interaction between the processing solution and the precursor imaged coatings before mechanical means (such as brush or plush rollers) are used.

Suitable processing apparatus include but are not limited to, the Quartz 850 RG that is currently available from NES Inc. (Westfield, Mass.) and the Heights Red Amber 40 that is currently available from Heights USA, Inc. (Trenton, N.J.).

Excess processing solution can be collected in a tank and used several times, and replenished if necessary from a reservoir of "fresh" processing solution. A replenisher solution can be of the same concentration as that used during processing, it can be provided in concentrated form and diluted with water at an appropriate time, or it can be comprise an entirely different composition. It may also be desirable to apply a "fresh" sample of the processing solution to each imaged lithographic printing plate precursor.

Following processing, the resulting lithographic printing plate can be used for printing without any need for a separate rinsing step using water.

The resulting lithographic printing plates can also be baked, after processing, in a postbake operation that can be carried out to increase run length. Baking can be carried out, for example, in a suitable oven at a temperature of less than 300° C. and typically at less than 250° C. for from about 2 to about 10 minutes. More typically, the baking is done very quickly at a temperature of from about 160° C. to about 220° C. (for example, at 190° C.) for up to five minutes (for example, up to two minutes). In some embodiments, the lithographic printing plates are postbaked at from about 160 to about 220° C. for up to two minutes.

Alternatively, the lithographic printing plates can be baked or cured by overall exposure to IR radiation at a wavelength of from about 800 to about 850 nm. This exposure creates conditions that enable very controllable baking effects with minimal distortion. For example, the lithographic printing plates can be passed through a commercial QuickBake 1250 oven (available from Eastman Kodak Company) at 4 feet (1.3 m) per minute at the 45% power setting of an infrared lamp to achieve a similar baking result from heating the plate in an oven at 200° C. for 2 minutes.

After off-press development, a lithographic ink and fountain solution can be applied to the printing surface of the lithographic printing plate for printing. The non-exposed regions of the outermost layer take up ink and the hydrophilic surface of the substrate revealed by the imaging and processing takes up the fountain solution. The ink is then transferred to a suitable receiving material (such as cloth, paper, metal, glass, or plastic) to provide one or more desired impressions of the image thereon. If desired, an intermediate "blanket" roller can be used to transfer the ink from the printing plate to the receiving material. The printing plates can be cleaned between impressions, if desired, using conventional cleaning means and chemicals.

With or without a post-exposure baking step after imaging and before development, the imaged elements also can be developed "on-press". In most on-press embodiments, a post-exposure baking step is omitted. The imaged element is mounted on press wherein the unexposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The fountain solution is taken up by the non-imaged regions, that is, the surface of the hydrophilic substrate, and ink is taken up by the imaged (non-removed) regions of the imaged layer. The ink is then transferred to a suitable receiving material as described above.

The following examples are presented to illustrate the practice of this invention but are not intended to be limiting in any manner.

EXAMPLES

Materials and Methods

Byk® 307 is a surfactant available from Byk Chemie (Wallingford, Conn.).

Calsuds CD-6 is a modified coconut diethanolamide surfactant available from Pilot Chemical Company (Cincinnati, Ohio).

Carbowax 8000 is a polyethylene glycol polymer available from Dow Chemical (Midland, Mich.).

Copolymer A is a 35/56/9 weight percent copolymer of benzyl methacrylate, N-methoxymethylmethacrylamide and methacrylic acid with an acid number of 60.

Copolymer Z was prepared as described in U.S. Patent Application Publication 2008/070152 (noted above).

Glucamate DOE-120 is a PEG 120 methyl glucose dioleate available from Lubrizol Corporation (Wickliffe, Ohio).

Hybridur® 580 is a 40% solids urethane-acrylic hybrid polymer dispersion in water available from Air Products and Chemicals (Allentown, Pa.).

IRT is an IR dye having the following structure and obtained from Showa Denko, Tokyo, Japan:

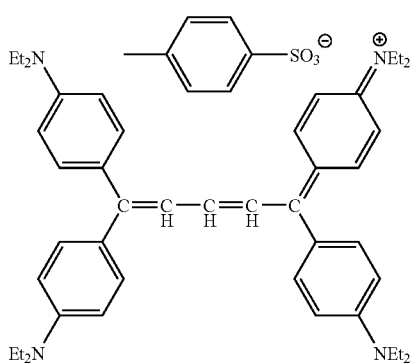

Naxan ABL is an alkylnaphthalene sulfonic acid surfactant available from Nease Performance Chemicals (Cincinnati, Ohio).

Oligomer A is a 30% by weight solution in ethyl acetate of a urethane acrylate prepared by reacting 2 parts of hexamethylene diisocyanate, 2 parts of hydroxyethyl methacrylate and 1 part of 2-(2-hydroxyethyl)piperidine.

Pigment 1 is a 27% solids dispersion of 7.7 parts of a poly(vinyl acetal) derived from poly(vinyl alcohol) acetalized with acetaldehyde, butyraldehyde, and 4-formylbenzoic acid, 76.9 parts of Irgalith Blue GLVO (Cu-phthalocyanine C.I. Pigment Blue 15:4), and 15.4 parts of Disperbyk® 167 dispersant (Byk Chemie) in 1-methoxy-2-propanol.

Sipomer PAM-100 is a phosphate-functional specialty monomer available from Rhodia (Cranbury, N.J.).

Sartomer 480 (SR-480) is an ethoxylated (10) bisphenol A dimethacrylate, available from Sartomer Company (Exton, Pa.).

Sartomer 399 (SR-399) is dipentaerythritol pentaacrylate, available from Sartomer Company.

Preparation of Copolymer B:

Dimethylacetamide (235.66 g), methyl methacrylate (16.3 g), acrylic acid (2.7 g), N-methoxymethylmethacrylamide (6.0 g), and Vazo-64 (0.25 g) were charged in a 500 ml 4-neck ground glass flask equipped with a heating mantle, temperature controller, mechanical stirrer, condenser, pressure equalized addition funnel and nitrogen inlet. The reaction mixture was heated to 80° C. under nitrogen atmosphere. A pre-mixture of methyl methacrylate (49.0 g), acrylic acid (7.0 g), N-methoxymethylmethacrylamide (19.0 g) and Vazo-64 (0.5 g) was added over two hours at 80° C. Reaction was continued another ten hours, and during processing, Vazo-64 (0.75 g) was added in increments. The polymer conversion was >99% based on a determination of percent of non-volatiles. The weight ratio of methyl methacrylate/N-methoxymethylmethacrylamide/acrylic acid was 65.3/9.7/25. The resulting polymer was isolated in powder form in a mixture of water/ice (3:1) using a Lab Dispersator (4000 rpm). The powder was dried at room temperature for 24 hours and then overnight at 45° C. The yield was >88%, and polymer acid number was 70.1 mg KOH/g.

Preparation of Copolymer D:

Dimethylacetamide (220.7 g) and polyethylene glycol methyl ether methacrylate (PEGMA) [30.0 g (50% solution in water, Mn=~2080)] were charged in a 500 ml 4-neck ground glass flask, equipped with a heating mantle, temperature controller, mechanical stirrer, condenser, pressure equalized addition funnel and nitrogen inlet. The reaction mixture was heated to 80° C. under nitrogen atmosphere. A pre-mixture of acrylonitrile (55.0 g), N-methoxymethylmethacrylamide (21.5 g), acrylic acid (8.5 g), and Vazo-64 (0.5 g) was added over two hours at 80° C. Reaction was continued another fifteen hours, and, during processing, Vazo-64 (1.35 g) was added in increments. The polymer conversion was >96% based on a determination of percent of non-volatiles. The weight ratio of PEGMA/acrylonitrile/N-methoxymethylmethacrylamide/acrylic acid was 15/55/21.5/8.5. The resulting polymer was isolated in powder form in a mixture of water/ice (3:1) using a Lab Dispersator (4000 rpm). The powder was dried at room temperature for 24 hours and then overnight at 45° C. The yield was >93%, and polymer acid number was 63.7.0 mg KOH/g.

Preparation of Copolymer E:

Methyl Cellosolve (227.8 g), N-methoxymethylmethacrylamide (21.0 g), benzyl methacrylate (13.7 g), acrylic acid (3.0 g), dodecylmercaptan (0.09 g), and Vazo-64 (0.37 g) were charged in a 500 ml 4-neck ground glass flask, equipped with a heating mantle, temperature controller, mechanical stirrer, condenser, pressure equalized addition funnel and nitrogen inlet. The reaction mixture was heated to 80° C. under nitrogen atmosphere. A pre-mixture of N-methoxymethylmethacrylamide (63.0 g), benzyl methacrylate (40.0 g), acrylic acid (9.3 g), dodecylmercaptan (0.25 g), and Vazo-64 (0.75 g) was added over two hours at 80° C. Reaction was continued another nineteen hours, and, during processing, Vazo-64 (0.38 g) was added in increments. The polymer conversion was >99% based on a determination of percent of non-volatiles. The weight ratio of N-methoxymethylmethacrylamide/benzyl methacrylate/acrylic acid was 56/35.8/8.2. The polymer was isolated in powder form in a mixture of water/ice (3:1) using a Lab Dispersator (4000 rpm). The powder was dried at room temperature for 24 hours and then overnight at 45° C. The yield was >60%, and polymer acid number was 63.2 mg KOH/g.

Preparation of Copolymer F:

Dimethylacetamide (100.25 g), N-methoxymethylmethacrylamide (6.0 g), acrylonitrile (8.0 g), methacrylic acid (2.25 g), benzyl methacrylate (8.5 g), dodecylmercaptan (0.06 g), and Vazo-64 (0.25 g) were charged in a 500 ml 4-neck ground glass flask equipped with a heating mantle, temperature controller, mechanical stirrer, condenser, pressure equalized addition funnel, and nitrogen inlet. The reaction mixture was heated to 80° C. under nitrogen atmosphere. A pre-mixture of dimethylacetamide (136.0 g), N-methoxymethylmethacrylamide (19.0 g), acrylonitrile (24.0 g), methacrylic acid (6.75 g), benzyl methacrylate (25.5 g), dodecylmercaptan (0.19 g), and Vazo-64 (0.5 g) was added over two hours at 80° C. Reaction was continued another nineteen hours, and during processing, Vazo-64 (1.35 g) was added in increments. The polymer conversion was >94% based on a determination of percent of non-volatiles. The weight ratio of N-methoxymethylmethacrylamide/acrylonitrile/-ethacrylic acid/benzyl methacrylate was 25/32/9.0/34. The polymer was isolated in powder form in a mixture of water/ice (3:1) using a Lab Dispersator (4000 rpm). The powder was dried at room temperature for 24 hours and then overnight at 45° C. The yield was >90%, and polymer acid number was 57.7 mg KOH/g.

Preparation of Copolymer G:

Dimethylacetamide (666.5 g), N-phenylmaleimide (55.0 g), acrylonitrile (124.0 g), methacrylic acid (27.5 g), N-methoxymethylmeth-acrylamide (41.0 g), methacrylamide (27.5 g), and Vazo-64 (2.75 g) were charged in a 5000 ml 4-neck ground glass flask equipped with a heating mantle, temperature controller, mechanical stirrer, condenser, pressure equalized addition funnel, and nitrogen inlet. The reaction mixture was heated to 80° C. under nitrogen atmosphere. A pre-mixture of dimethylacetamide (1000 g), N-phenylmaleimide (165.0 g), acrylonitrile (371.0 g), methacrylic acid (82.5 g), N-methoxymethylmethacrylamide (124.0 g), methacrylamide (82.5 g), and Vazo-64 (5.5 g) was added over two hours at 80° C. Reaction was continued another thirteen hours, and during processing, Vazo-64 (5.5 g) was added in increments. The polymer conversion was >98% based on a determination of percent of non-volatiles. The weight ratio of N-phenylmaleimide/acrylonitrile/methacrylic acid/N-methoxymethylmethacrylamide/methacrylamide was at 20/45/10/15/10. The polymer was isolated in powder form in a mixture of water/ice (3:1) using a Lab Dispersator (4000 rpm). The powder was dried at room temperature for 24 hours and then overnight at 45° C. The yield was >93%, and polymer acid number was 67.0 mg KOH/g.

Invention Example 1

An imageable layer formulation was prepared as shown below in TABLE I. The formulation was applied to an electrochemically grained sulfuric acid-anodized aluminum substrate that had been post-treated with a monosodium phosphate solution containing sodium fluoride, and the coating was dried to a film weight of 1.9/m². The imageable layer was then coated with a solution consisting of 5.64% poly(vinyl alcohol) (88% hydrolyzed), 0.3% poly(vinyl pyrrolidone), 3.76% isopropanol, and 90.3% water and dried to a film weight of 1.9 g/m².

The resulting imageable element was imaged using a Luxel Vx-9600 violet platesetter with a series of solid and 8×8 pixel patterns at exposures ranging from 1.4 to 165 µJ/cm². The imaged element was processed with Agfa RC510 pre-bake gum in a Quartz 850 RG "rinse/gum" unit (gum in both sections). The element photosensitivity was found to be 40 µJ/cm² based on the area of the 8×8 pixels.

A second sample of the same element was baked at 110° C. after imaging and similarly processed. Its photosensitivity was the same as the non-baked element, but the processed density increased from about 0.7 to about 1.0.

Another sample of the imageable element was imaged at 56 µJ/cm² and was processed as described above (with the post-exposure bake). It was mounted on a Miehle press and used to print 16,000 good quality copies.

TABLE I

| Component | Weight % |
| --- | --- |
| Copolymer A | 2.65 |
| SR-480 | 1.72 |
| Oligomer | 5.74 |
| Sipomer PAM-100 | 0.09 |
| 2-Phenyl-5-(4-diethylaminophenyl)-4-(2-chlorophenyl)oxazole | 0.62 |
| 2,2'-Bis(2-chlorophenyl)-4,4',5,5'-tetraphenylbiimidazole | 0.27 |
| 3-mercapto-1,2,4-triazole | 0.49 |
| Pigment 1 | 1.20 |
| Byk ® 307 surfactant | 0.01 |
| 1-Methoxy-2-propanol | 52.20 |
| 2-Butanone | 27.64 |
| Water | 1.84 |
| γ-Butyrolactone | 5.53 |

Invention Example 2

An imageable layer formulation was prepared as shown below in TABLE II. The formulation was applied to an electrochemically grained sulfuric acid-anodized aluminum substrate that had been post-treated with a monosodium phosphate solution containing sodium fluoride, and the coating was dried to a film weight of 1.9/m². The imageable layer was then coated with a solution consisting of 5.64% poly(vinyl alcohol) (88% hydrolyzed), 0.3% poly(vinyl pyrrolidone), 3.76% isopropanol, and 90.3% water and dried to a film weight of 1.9 g/m².

The resulting imageable element was imaged on a Luxel Vx-9600 violet platesetter with a series of solid and 8×8 pixel patterns at exposures ranging from 1.4 to 165 µJ/cm². The imaged element was baked at 110° C. and then the top-coat was washed off with water. The imaged element was then processed with Agfa RC510 prebake gum through a Glunz & Jensen Raptor processor. The element photosensitivity was found to be 54 µJ/cm² based on the area of the 8×8 pixel pattern.

A second sample of the same element was imaged at 76 µJ/cm² and processed as described above. It was mounted on a Heidelberg Speedmaster press and used to print 40,000 good quality copies.

TABLE II

| Component | Weight % |
| --- | --- |
| Copolymer B | 2.65 |
| SR-480 | 1.72 |
| Oligomer A | 5.74 |
| Sipomer PAM100 | 0.09 |
| 2-Phenyl-5-(4-diethylaminophenyl)-4-(2-chlorophenyl)oxazole | 0.62 |
| 2,2'-Bis(2-chlorophenyl)-4,4',5,5'-tetraphenylbiimidazole | 0.27 |
| 3-Mercapto-1,2,4-triazole | 0.49 |
| Pigment 1 | 1.20 |
| Byk ® 307 surfactant | 0.01 |
| 1-Methoxy-2-propanol | 52.20 |
| 2-Butanone | 27.64 |
| Water | 1.84 |
| γ-Butyrolactone | 5.53 |

Comparative Example 1

An imageable layer formulation was prepared as shown above in TABLE II except that Copolymer C, an 87/13 mole percent copolymer of methyl methacrylate and acrylic acid, was used in place of Copolymer B. An imageable element was prepared with this formulation to prepare an imageable layer. The imageable layer failed to process (that is, the unexposed areas did not develop away) using the Agfa RC510 pre-bake gum when imaged and processed as described in Invention Example 2.

Invention Example 3

An imageable element was prepared as described in Invention Example 2 except that the imageable layer formulation is shown below in TABLE III. The photosensitivity of the resulting imageable element based on 8×8 pixel areas following processing with Agfa RC510 pre-bake gum through a Glunz & Jensen Raptor processor was found to be 13 µJ/cm².

TABLE III

| Component | Weight % |
| --- | --- |
| Copolymer D | 2.68 |
| SR-480 | 0.70 |
| Oligomer A | 9.28 |
| Sipomer PAM100 | 0.09 |

TABLE III-continued

| Component | Weight % |
|---|---|
| 2-Phenyl-5-(4-diethylaminophenyl)-4-(2-chlorophenyl)oxazole | 0.63 |
| 2,2'-Bis(2-chlorophenyl)-4,4',5,5'-tetraphenylbiimidazole | 0.27 |
| 3-Mercapto-1,2,4-triazole | 0.49 |
| Pigment 1 | 1.22 |
| Byk ® 307 surfactant | 0.01 |
| 1-Methoxy-2-propanol | 32.94 |
| 2-Butanone | 27.62 |
| Dimethylacetamide | 24.08 |

Invention Example 4

An imageable element was prepared as described in Invention Example 2 except that the formulation used to prepare the imageable layer was as shown below in TABLE IV. The photosensitivity of the resulting element based on 8×8 pixel areas following processing with Agfa RC510 pre-bake gum through a Glunz & Jensen Raptor processor was found to be 26 µJ/cm$^2$.

TABLE IV

| Component | Weight % |
|---|---|
| Copolymer E | 2.64 |
| SR-480 | 0.69 |
| Oligomer A | 9.15 |
| Sipomer PAM100 | 0.09 |
| 2-Phenyl-5-(4-diethylaminophenyl)-4-(2-chlorophenyl)oxazole | 0.62 |
| 2,2'-Bis(2-chlorophenyl)-4,4',5,5'-tetraphenylbiimidazole | 0.27 |
| 3-Mercapto-1,2,4-triazole | 0.49 |
| Pigment 1 | 1.20 |
| Byk ® 307 surfactant | 0.01 |
| 1-Methoxy-2-propanol | 46.14 |
| 2-Butanone | 27.65 |
| Water | 5.53 |
| γ-Butyrolactone | 5.53 |

Invention Example 5

An imageable element was prepared as described in Invention Example 2 except that the imageable layer formulation is that shown in TABLE V. The photosensitivity of the resulting imageable element based on 8×8 pixel areas following hand-processing with neutral Developer A (composition shown below in TABLE VI) was found to be 37 µJ/cm$^2$.

TABLE V

| Component | Weight % |
|---|---|
| Copolymer F | 2.65 |
| SR-480 | 1.72 |
| Oligomer A | 5.74 |
| Sipomer PAM100 | 0.09 |
| 2-Phenyl-5-(4-diethylaminophenyl)-4-(2-chlorophenyl)oxazole | 0.62 |
| 2,2'-Bis(2-chlorophenyl)-4,4',5,5'-tetraphenylbiimidazole | 0.27 |
| 3-Mercapto-1,2,4-triazole | 0.49 |
| Pigment 1 | 1.20 |
| Byk ® 307 surfactant | 0.01 |
| 1-Methoxy-2-propanol | 52.20 |
| 2-Butanone | 27.64 |
| Water | 1.84 |
| γ-Butyrolactone | 5.53 |

TABLE VI

| Component | Weight % |
|---|---|
| Calsuds CD-6 | 0.49 |
| Glucamate DOE-120 | 1.47 |
| Carbowax 8000 | 1.47 |
| Tetra potassium pyrophosphate | 1.80 |
| Ethylenediaminetetraacetic acid | 0.28 |
| Naxan ABL | 16.97 |
| Water | 77.52 |
| pH | 7.9 |

Invention Example 6

An imageable element was prepared as described in Invention Example 2 except that the formulation used to prepare the imageable layer is shown in TABLE VII below. The resulting imageable element was imaged at 56 µJ/cm$^2$ and then was mounted on an ABDick 9870 duplicator press without prior processing. The non-exposed regions (background) in the imaged layer came off when the form rollers were engaged and as paper was fed through the press, resulting in good quality printed images after fewer than 50 impressions.

TABLE VII

| Component | Weight % |
|---|---|
| Copolymer A | 1.76 |
| Copolymer G | 0.88 |
| SR-480 | 1.72 |
| Oligomer A | 5.72 |
| Sipomer PAM100 | 0.09 |
| 2-Phenyl-5-(4-diethylaminophenyl)-4-(2-chlorophenyl)oxazole | 0.62 |
| 2,2'-Bis(2-chlorophenyl)-4,4',5,5'-tetraphenylbiimidazole | 0.27 |
| 3-Mercapto-1,2,4-triazole | 0.49 |
| Pigment 1 | 1.20 |
| Byk ® 307 surfactant | 0.01 |
| 1-Methoxy-2-propanol | 48.55 |
| 2-Butanone | 27.65 |
| Water | 5.53 |
| γ-Butyrolactone | 5.53 |

Invention Example 7

An imageable element was prepared as described in Invention Example 2 except that the amount of Oligomer A was increased at the expense of SR-480 and the Sipomer PAM 100 was omitted as shown below in TABLE VIII. The photosensitivity of the resulting element based on 8×8 pixel areas following processing with Agfa RC510 prebake gum through a Glunz & Jensen Raptor processor was found to be 26 µJ/cm$^2$.

The processed plate was mounted on a Heidelberg Speedmaster press and was used to print 5,000 good copies, with no background sensitivity from the first print. This example shows that phosphate ester monomers such as Sipomer PAM 100 are not required to enable processing coatings in the imageable elements of the present invention using gum solutions.

TABLE VIII

| Component | Weight % |
|---|---|
| Copolymer A | 2.64 |
| SR-480 | 0.69 |
| Oligomer A | 9.15 |
| Sipomer PAM100 | 0 |
| 2-Phenyl-5-(4-diethylaminophenyl)-4-(2-chlorophenyl)oxazole | 0.62 |
| 2,2'-Bis(2-chlorophenyl)-4,4',5,5'-tetraphenylbiimidazole | 0.27 |
| 3-Mercapto-1,2,4-triazole | 0.49 |
| Pigment 1 | 1.20 |
| Byk ® 307 surfactant | 0.01 |
| 1-Methoxy-2-propanol | 46.18 |
| 2-Butanone | 27.68 |
| Water | 5.54 |
| γ-Butyrolactone | 5.54 |

Comparative Example 2

Invention Example 7 was repeated except that a 24/76 mole % copolymer of methacrylic acid and methyl methacrylate was used in place of Copolymer A. Despite the high acidity of the copolymer, the imaged element could not be processed using RC510.

Invention Example 8

An imageable element was prepared as described in Invention Example 2 except that the formulation used to prepare the imageable layer was that shown in TABLE IX below. The resulting imageable element was imaged on a Kodak® Trendsetter Quantum 800 II at 170 rpm while varying the laser power from 3 W to 18 W. The imaged element was baked at 110° C. and then the topcoat was washed off with water. The element was then processed using Agfa RC510 prebake gum in a Glunz & Jensen Raptor processor. Uniform solids and clean background and 8×8 pixel patterns of 50% area were obtained at the lowest exposure (49 mJ/cm$^2$).

TABLE IX

| Component | Weight % |
|---|---|
| Copolymer A | 2.64 |
| SR-480 | 1.72 |
| Oligomer A | 5.73 |
| Sipomer PAM100 | 0.09 |
| IRT IR Dye | 0.18 |
| 4,4'-Bis(t-butylphenyl)iodonium tetraphenylborate | 0.22 |
| Pigment 1 | 1.20 |
| Byk ® 307 surfactant | 0.01 |
| 1-Methoxy-2-propanol | 68.19 |
| 2-Butanone | 17.42 |
| Water | 2.61 |

Invention Example 9

An imageable element was prepared, imaged, and processed as described in Invention Example 2, except that the composition of the formulation used to prepare the imageable layer was as described below in TABLE X. The photosensitivity of the resulting printing plate based on 8×8 pixel areas following processing with Agfa RC510 pre-bake gum was found to be 37 μJ/cm$^2$. Invention Example 9 shows that the use of Copolymer Z allowed for processing using the pre-bake gum when no other polymeric binders were present in the imageable layer.

TABLE X

| Component | Weight % |
|---|---|
| Copolymer Z | 2.60 |
| SR-480 | 1.69 |
| Oligomer A | 5.65 |
| Sipomer PAM100 | 0.09 |
| 2-Phenyl-5-(4-diethylaminophenyl)-4-(2-chlorophenyl)oxazole | 0.61 |
| 2,2'-Bis(2-chlorophenyl)-4,4',5,5'-tetraphenylbiimidazole | 0.26 |
| 3-Mercapto-1,2,4-triazole | 0.48 |
| Pigment 1 | 1.19 |
| Byk ® 307 | 0.01 |
| 1-Methoxy-2-propanol | 41.28 |
| 2-Butanone | 27.68 |
| Water | 9.23 |
| γ-Butyrolactone | 9.23 |

Comparative Example 3

An imageable element was prepared as described in Example 2 except that the composition of the formulation used to prepare the imageable layer was as described below in TABLE XI. The topcoat was washed off with water, and the imaged element was then processed using Agfa RC510 pre-bake gum in a Glunz & Jensen Raptor processor. The coating was still substantially intact after passing through the processor. Thus, no processing was accomplished in this example using the noted prebake gum. Comparative Example 3 was practiced similarly to Example 17 of U.S. Patent Application Publication 2008/0070152 (noted above), but with a different treated substrate and a thicker topcoat layer.

TABLE XI

| Component | Weight % |
|---|---|
| Copolymer Z | 1.25 |
| Hybridur ® 580 | 9.02 |
| SR-399 | 2.51 |
| NK Ester A-DPH | 2.51 |
| IRT IR Dye | 0.35 |
| 4,4'-Bis(t-butylphenyl)iodonium tetraphenylborate | 1.00 |
| Crystal Violet | 0.15 |
| Zonyl ® FSN-100 | 0.10 |
| Methanol | 10.53 |
| 2-Butanone | 58.56 |
| Water | 3.84 |
| γ-Butyrolactone | 10.18 |

The invention has been described in detail with particular reference to certain preferred embodiments thereof, but it will be understood that variations and modifications can be effected within the spirit and scope of the invention.

The invention claimed is:
1. A method of making an image comprising:
A) imagewise exposing a negative-working lithographic printing plate precursor using imaging radiation to provide both exposed and non-exposed regions in the imageable layer,
said lithographic printing plate precursor comprising a substrate and having thereon an imageable layer comprising:
a free-radically polymerizable component,
an initiator composition that is capable of generating free radicals sufficient to initiate polymerization of said free-radically polymerizable component upon exposure to said imaging radiation in the presence of a radiation absorbing compound, a radiation absorbing compound having a $\lambda_{max}$ of from about 700 to about 1400 nm, and a primary polymeric binder that comprises recurring units derived from one or more N-alkoxymethyl (meth)acrylamides in an amount of from 20 to 75 weight %, based on the total dry primary polymeric binder weight, wherein said primary polymeric binder is present in an amount of from about 12 to about 70% based on total imageable layer dry weight, and B) applying a single silicate-free and metasilicate-free processing solution off-press to said imaged precursor to remove predominantly only said non-exposed regions and to provide a protective coating over the resulting imaged and developed surface having exposed and non-exposed regions, said processing solution having a pH of from about 3 to about 11 to provide a lithographic printing plate, the lithographic printing plate requiring no separate gumming and rinsing steps before it is used for lithographic printing.

2. The method of claim 1 wherein said primary polymeric binder comprises recurring units of one or more of N-(methoxymethyl)methacrylamide, N-(isobutoxymethyl)methacrylamide, N-(isobutoxymethyl)acrylamide, and N-(butoxymethyl)acrylamide.

3. The method of claim 1 wherein said primary polymeric binder further comprises from about 25 to about 90%, based on total primary polymeric binder weight, of recurring units derived from the group consisting of one or more (meth)acrylates, N-substituted cyclic imides, (meth)acrylamides, vinyl carbazole, monomers containing carboxy groups or anhydrides providing carboxy groups, (meth)acrylonitriles, N-vinyl lactams, vinyl esters, and vinyl arenes.

4. The method of claim 1 wherein said imageable layer further comprises a secondary polymeric binder that is present in an amount of from about 5 to about 45% based on total imageable layer dry weight.

5. The method of claim 1 wherein said initiator composition comprises an onium salt.

6. The method of claim 1 wherein said processing solution consists essentially of from about 0.1 to about 45 weight % of one or more anionic surfactants.

7. The method of claim 6 wherein said processing solution comprises includes at least 0.001 weight % of an organic phosphonic acid or polycarboxylic acid, or a salt of either acid that is different than said anionic surfactant.

8. The method of claim 1 wherein said processing solution has a pH of from about 5 to about 9.

9. The method of claim 1 further comprising:
after step B, baking said imaged and processed precursor at a temperature of from about 160 to about 220° C. for up to two minutes.

10. The method of claim 1 further comprising:
after step B, removing excess processing solution from said lithographic printing plate using a squeegee or nip rollers, and optionally drying said lithographic printing plate.

11. The method of claim 1 wherein said processing solution comprises from about 5 to about 45 weight % of one or more anionic surfactants, at least one of which is an alkyl-diphenyloxide disulfonate, and optionally comprising from about 8 to about 20 weight % of an alkali alkyl naphthalene sulfonates.

12. The method of claim 1 wherein said lithographic printing plate precursor further comprises a water-soluble topcoat disposed over said imageable layer.

13. The method of claim 12 wherein said topcoat layer is removed from said imaged element between steps A and B.

14. A method of lithographic printing comprising:
A) imagewise exposing a negative-working lithographic printing plate precursor using infrared imaging radiation to provide both exposed and non-exposed regions in the imageable layer,
said lithographic printing plate precursor comprising a substrate and having thereon an imageable layer comprising:
a free-radically polymerizable component,
an initiator composition that is capable of generating free radicals sufficient to initiate polymerization of said free-radically polymerizable component upon exposure to said imaging radiation in the presence of a radiation absorbing compound,
a radiation absorbing compound having a $\lambda_{max}$ of from about 700 to about 1400 nm, and
a primary polymeric binder that comprises recurring units derived from one or more N-alkoxymethyl (meth)acrylamides in an amount of from 20 to 75 weight %, based on the total dry primary polymeric binder weight, wherein said primary polymeric binder is present in an amount of from about 12 to about 70% based on total imageable layer dry weight, B) applying a single silicate-free and metasilicate-free processing solution off-press to said imaged precursor both (1) to remove predominantly only said non-exposed regions, and (2) to provide a protective coating over all of said exposed and non-exposed regions to provide a lithographic printing plate,
said processing solution having a pH of from about 3 to about 11 and comprising at least 0.1 weight % of an anionic surfactant, C) removing excess processing solution from said lithographic printing plate without separate rinsing and gumming steps, and optionally drying said lithographic printing plate, and D) without removing said protective coating, using said lithographic printing plate for printing an image using a lithographic printing ink.

15. A method of making an image comprising:
A) imagewise exposing a negative-working lithographic printing plate precursor using infrared imaging radiation to provide both exposed and non-exposed regions in the imageable layer,
said lithographic printing plate precursor comprising a substrate and having thereon an imageable layer comprising:
a free-radically polymerizable component,
an initiator composition that is capable of generating free radicals sufficient to initiate polymerization of said free-radically polymerizable component upon exposure to said imaging radiation in the presence of a radiation absorbing compound,
a radiation absorbing compound having a $\lambda_{max}$ of from about 700 to about 1400 nm, and
a primary polymeric binder that comprises recurring units derived from one or more N-alkoxymethyl (meth)acrylamides in an amount of from 20 to 75 weight %, based on the total dry primary polymeric binder weight, wherein said primary polymeric binder is present in an amount of from about 12 to about 70% based on total imageable layer dry weight, and B) processing said imaged precursor on-press using a fountain solution, lithographic printing ink, or both, to remove predominantly only said non-exposed regions.

16. A negative-working lithographic printing plate precursor comprising a substrate and having thereon an imageable layer comprising:

a free-radically polymerizable component, an initiator composition that is capable of generating free radicals sufficient to initiate polymerization of said free-radically polymerizable component upon exposure to imaging radiation in the presence of a radiation absorbing compound, a radiation absorbing compound having a $\lambda_{max}$ of from about 700 to about 1400 nm, and a primary polymeric binder that comprises recurring units derived from one or more N-alkoxymethyl(meth)acrylamides, provided that such recurring units are present in said primary polymeric binder in an amount of in an amount of from 20 to 75 weight % based on the total dry primary polymeric binder weight, wherein said primary polymeric binder is present in an amount of from about 12 to about 70% based on total imageable layer dry weight.

17. The element of claim 16 wherein said primary polymeric binder comprises recurring units derived from the group consisting of one or more of N-(methoxymethyl)methacrylamide, N-(isobutoxymethyl)methacrylamide, N-(isobutoxymethyl)acrylamide, and N-(butoxymethyl)acrylamide, and from about 10 to about 75 weight % of recurring units derived from one or more (meth)acrylic acids or esters, based on total primary polymeric binder weight.

18. The element of claim 16 wherein said substrate is a sulfuric acid anodized aluminum-based substrate.

19. The element of claim 16 wherein said initiator composition comprises an onium salt.

* * * * *